United States Patent [19]

Dingwall

[11] 4,173,022
[45] Oct. 30, 1979

[54] INTEGRATED GATE FIELD EFFECT TRANSISTORS HAVING CLOSED GATE STRUCTURE WITH CONTROLLED AVALANCHE CHARACTERISTICS

[75] Inventor: Andrew G. F. Dingwall, Bridgewater, N.J.

[73] Assignee: RCA Corp., New York, N.Y.

[21] Appl. No.: 904,454

[22] Filed: May 9, 1978

[51] Int. Cl.$^2$ .................................................. H01L 29/78
[52] U.S. Cl. ....................................... 357/23; 357/55; 357/68
[58] Field of Search ............................ 357/23, 55, 68

[56] References Cited

U.S. PATENT DOCUMENTS

| | | | |
|---|---|---|---|
| 3,917,964 | 11/1975 | Carlson | 357/23 |
| 4,025,940 | 5/1977 | Kimura et al. | 357/23 |
| 4,063,274 | 12/1977 | Dingwall | 357/53 |

*Primary Examiner*—Edward J. Wojciechowicz
*Attorney, Agent, or Firm*—H. Christoffersen; D. S. Cohen; Sanford J. Asman

[57] ABSTRACT

Insulated gate field effect transistors (IGFETs) having closed gate geometries and controlled avalanche characteristics are described. The shape of the closed geometry gate is altered from the rectangular shape used heretofore in order to thereby alter the shape of the drain of the transistor and to control its avalanche characteristics.

4 Claims, 5 Drawing Figures

U.S. Patent     Oct. 30, 1979     4,173,022
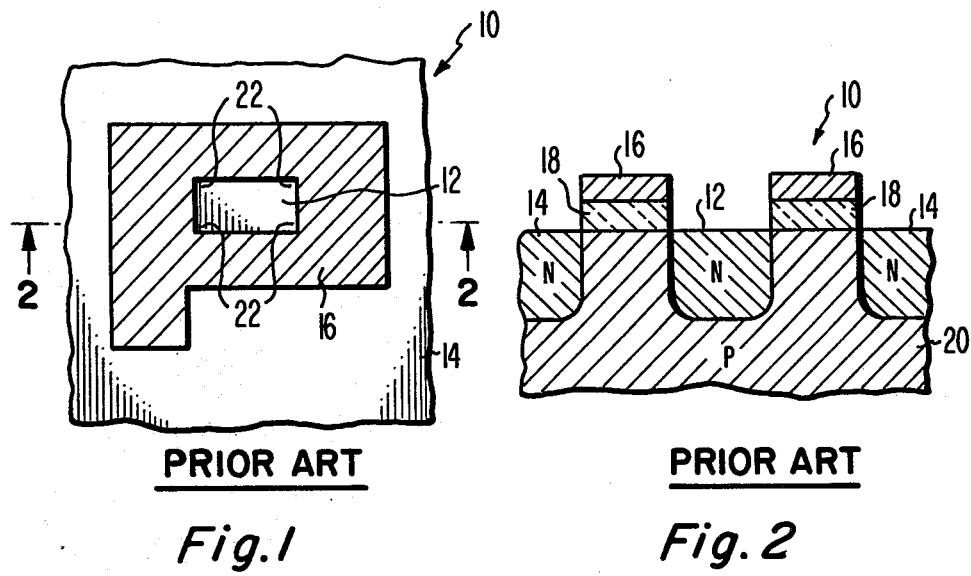
PRIOR ART
Fig.1
PRIOR ART
Fig.2
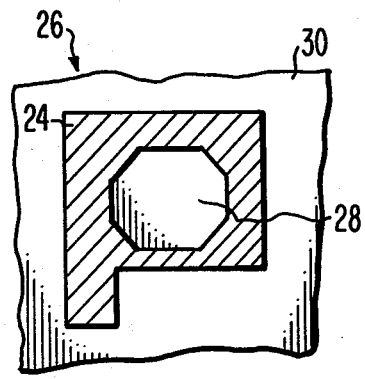
Fig.3
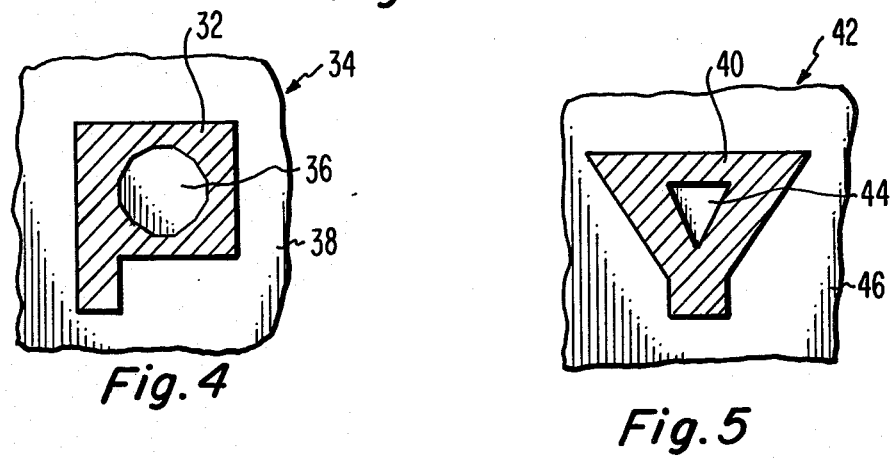
Fig.4
Fig.5

INTEGRATED GATE FIELD EFFECT TRANSISTORS HAVING CLOSED GATE STRUCTURE WITH CONTROLLED AVALANCHE CHARACTERISTICS

The present invention relates to insulated gate field effect transistors (IGFETs). In particular, the invention relates to IGFETs having a closed geometry of the type described in U.S. Pat. No. 4,063,274 issued on Dec. 13, 1977 to the present inventor.

For most applications of IGFETs, high avalanche voltages are desirable because they allow for a higher voltage rating. However, there are certain applications in which lower avalanche voltage transistors (IGFETs) or a combination of high and low avalanche voltage IGFETs on a single integrated circuit are desired. Such applications include protection circuits, FAMOS-type transistors which are used in field programmable memories, MNOS transistors or where tunneling of hot-electrons from an avalanche junction is important.

The basic rectangular gate IGFET described in the patent identified above is employed in complementary symmetry integrated circuits which have come to be known as "C²L" circuits which stands for Closed CMOS Logic. By viewing operating C²L devices through a microscope in the dark it has been shown that the corners of the enclosed drains "light up" first, which means that avalanche starts at the drain corners. Thus, the inventor has determined that by varying the geometry of the corners he could vary the avalanche characteristics of the IGFETs.

In the Drawings:

FIG. 1 is a top view of a closed gate IGFET of the type used in C²L devices employed in the prior art;

FIG. 2 is a cross section taken along the line 2—2 of the IGFET of FIG. 1;

FIGS. 3–5 are top views of IGFETs including the present invention.

Referring now to FIGS. 1 and 2, shown is a top view of an IGFET 10 having a closed gate geometry of the type more fully described in U.S. Pat. No. 4,063,274, issued to A. G. F. Dingwall on Dec. 13, 1977, which patent is incorporated herein by reference. The IGFET 10 includes a drain 12, source 14, and a conductive gate 16. The gate 16 has a closed, rectangular geometry, which means that it totally encloses the drain 12 when viewed from the top. Underlying the gate 16 is an insulating layer 18, which is usually comprised of silicon dioxide. The semiconductor material which comprises the substrate 20 in which the drain 12 and source 14 are formed is usually silicon and may be either N or P type conductivity. In this example the substrate 12 has P type conductivity and the drain and source 12, 14, respectively, are each N type silicon.

In order to manufacture complementary symmetry IGFETs on a single substrate, the P type substrate 20 is a P well formed in an N type body, in which N channel IGFETs are formed, whereas P channel IGFETs are formed by placing P type source and drains into the N type body.

With reference to FIG. 1, the rectangular structure of the gate 16 has been observed to have an avalanche which begins at the corners 22 between the gate 16 and the drain 12. It has been observed that the avalanche voltage is increased when the internal angles of the gate are increased from 90°. It has also been found that the avalanche voltage is decreased when the internal angles of the gate of the closed gate IGFETs are decreased.

Referring to FIG. 3, a top view of the gate 24 of an IGFET 26 is shown. The gate 24 surrounds a drain 28 and is surrounded by a source 30. The internal angles of the gate 24 are each 135° and form an octagonal shaped drain 28. Assuming that all doping concentrations of the IGFET 26 and the IGFET 10 are the same, the IGFET 26 will have a breakdown voltage about 10% greater than the breakdown voltage of the IGFET 10.

Referring to FIG. 4, a top view of the gate 32 of an IGFET 34 is shown. The gate 32 surrounds a drain 36 and is surrounded by a source 38. The internal angles of the gate 32 are each 150° and form a drain 36 having 12 sides. Assuming that all doping concentrations of the IGFET 34 and the IGFET 10 are the same, the IGFET 34 will have a breakdown voltage which is up to about 13% larger than than of the IGFET 10.

Referring now to FIG. 5, a top view of the gate 40 of an IGFET 42 is shown. The gate 40 surrounds a drain 44 and is surrounded by a source 46. The internal angles of the gate 40 are each 60 degrees and form triangular drain 44. Assuming that all doping concentrations of the IGFET 42 and the IGFET 10 are the same, the IGFET 42 will have a breakdown voltage reduced to as much as about 13% less than the breakdown voltage of the IGFET 10.

It should be noted that the external shape of the gates 16, 24, 32, 40 of the IGFETs 10, 26, 34, 42 is generally rectangular but may vary without affecting the breakdown voltage of the transistors, as it has been determined experimentally that it is the shape of the internal corners which affects breakdown voltage. Also, while the internal shapes of the gate region are preferably selected to be equiangular, i.e. all angles being equal, other angular relationships may be desirable in specific situations.

What is claimed is:

1. An IGFET having a closed geometry gate comprising:
    (a) a body of semiconductor material of a first conductivity type, said body having a surface;
    (b) a closed geometry gate comprising:
        (i) a layer of insulating material on the surface of said body; and
        (ii) a layer of conductive material on the surface of said layer of insulating material;
    (c) a source region surrounding said gate and extending into said body, said source region having a conductivity type opposite that of said body;
    (d) a drain region surrounded by said gate and extending into said body, said drain region having a conductivity type opposite to the conductivity type of said body, the shape of said drain region being determined by the internal shape of said gate region, said shape being selected to be equiangular and to have a number of corners other than four, said shape determining the breakdown voltage of said IGFET.

2. The IGFET of claim 1 wherein said drain has at least five corners.

3. The IGFET of claim 1 wherein said drain has three corners.

4. The IGFET of claim 1 wherein said internal shape is equilateral.